(12) United States Patent
Cho et al.

(10) Patent No.: US 7,553,767 B2
(45) Date of Patent: Jun. 30, 2009

(54) METHOD FOR FABRICATING SEMICONDUCTOR DEVICE HAVING TAPER TYPE TRENCH

(75) Inventors: Yong-Tae Cho, Ichon-shi (KR); Eun-Mi Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 296 days.

(21) Appl. No.: 11/455,847

(22) Filed: Jun. 20, 2006

(65) Prior Publication Data

US 2007/0072389 A1 Mar. 29, 2007

(30) Foreign Application Priority Data

Sep. 29, 2005 (KR) .................. 10-2005-0091580

(51) Int. Cl.
*H01L 21/302* (2006.01)
*H01L 21/461* (2006.01)

(52) U.S. Cl. .................. 438/689; 438/221; 438/427

(58) Field of Classification Search .............. 438/221, 438/427, 689, 701, 711
See application file for complete search history.

(56) References Cited

U.S. PATENT DOCUMENTS

| | | | |
|---|---|---|---|
| 4,839,306 A | 6/1989 | Wakamatsu | |
| 6,127,278 A | 10/2000 | Wang et al. | |
| 6,140,207 A * | 10/2000 | Lee | 438/427 |
| 7,064,381 B2 * | 6/2006 | Koh | 257/315 |
| 7,148,112 B2 * | 12/2006 | Choi | 438/270 |
| 7,265,022 B2 * | 9/2007 | Ito et al. | 438/424 |
| 2002/0056886 A1 | 5/2002 | Usui et al. | |
| 2004/0121552 A1 | 6/2004 | Seo | |
| 2006/0263991 A1 * | 11/2006 | Lee et al. | 438/296 |
| 2007/0173007 A1 * | 7/2007 | Lee et al. | 438/209 |

FOREIGN PATENT DOCUMENTS

| | | |
|---|---|---|
| CN | 1106038 | 4/2003 |
| KR | 10-2000-0027760 A | 5/2000 |
| KR | 10-2005-0025197 A | 3/2005 |

OTHER PUBLICATIONS

Notice of Preliminary Rejection from the Korean Intellectual Property Office, dated Nov. 20, 2006, in counterpart Korean Patent Application No. 2005-0091580.
Chinese Office Action dated Jan. 31, 2008.
D. R. Chuang, "Technology for Fabricating VLSI," 3rd Ed., Gau-Lih Books Inc., Taipei (1997), pp. 276-277.
C.Y. Chang, "ULSI Technology," McGraw-Hill Book Co., Singapore (1996), p. 355.
English Translation of Notification for the Opinion of Examination issued from the Taiwan Intellectual Property Office on May 15, 2008, from counterpart Taiwan Patent Application No. 95120891.

* cited by examiner

*Primary Examiner*—Phuc T Dang
(74) *Attorney, Agent, or Firm*—Finnegan, Henderson, Farabow, Garrett & Dunner, L.L.P.

(57) ABSTRACT

A method for fabricating a semiconductor includes: etching a substrate to a predetermined depth to form an upper trench with taper edges; etching the substrate beneath the upper trench to form a lower trench with approximately vertical edges; forming a device isolation layer disposed within the upper and lower trenches; and etching an active region of the substrate defined by the upper and lower trenches to a predetermined depth to form a recess pattern for a gate.

14 Claims, 10 Drawing Sheets

METHOD FOR FABRICATING SEMICONDUCTOR DEVICE HAVING TAPER TYPE TRENCH

RELATED APPLICATION

The present application is based upon and claims benefit of priority from Korean patent application No. KR 2005-0091580, filed in the Korean Patent Office on Sep. 29, 2005, the entire contents of which are incorporated herein by reference.

TECHNICAL FIELD

The present invention relates to a method for fabricating a semiconductor device; and more particularly, to a method for fabricating a semiconductor device having a trench using a shallow trench isolation (STI) process.

DESCRIPTION OF RELATED ARTS

During a dynamic random access memory (DRAM) process of a semiconductor device with a feature size less than approximately 0.10 μm, a recess gate process has been used to increase a channel length and improve a threshold voltage (Vt) hump property in the perspective of the electrical property of the semiconductor device.

Recently, a device isolation process has used a shallow trench isolation (STI) process.

FIGS. 1A to 1B are cross-sectional views illustrating a typical method for fabricating a semiconductor device.

As shown in FIG. 1A, a patterned pad oxide layer 12, a patterned pad nitride layer 13, and a photoresist pattern 14 are formed over a patterned substrate 11. Although not shown, processes of forming the patterned pad oxide layer 12, the patterned pad nitride layer 13, the photoresist pattern 14, and the patterned substrate 11 will be explained hereinafter.

A pad oxide layer, and a hard mask layer or a pad nitride layer used as a stopper during a chemical mechanical polishing (CMP) process for the device isolation (hereinafter, referred to as "device isolation CMP process") are deposited on a substrate in which trenches are to be formed.

A photoresist layer is deposited and then, subjected to a developing process and a patterning process. Thus, the photoresist pattern 14 is formed. Afterwards, the pad nitride layer and the pad oxide layer are etched by using the photoresist pattern 14 as a mask. Thus, the patterned pad nitride layer 13 and the patterned pad oxide layer 12 are formed.

A plurality of trenches 15 for device isolation are formed by etching the substrate by using the photoresist pattern 14, the patterned pad nitride layers 13 and the patterned pad oxide layers 12 as a mask. At this time, an angle α between a sidewall of the trench 15 and the top surface of the substrate is required to be 90° as much as possible to minimize a horn height which is an indicator of a bottom flatness during subsequently patterning a recess gate pattern.

As shown in FIG. 1B, the photoresist pattern 14 is removed.

A gap-filling insulation layer 16 is additionally filled inside the trenches 15 and then, a device isolation CMP process is performed using the patterned pad nitride layer 13 as a mask. Afterwards, the patterned pad nitride layer 13 and the patterned pad oxide layer 12 are removed.

A recess gate etching process to form recess gates is performed and thus, a plurality of recess patterns 17 are formed.

FIG. 1C is a cross-sectional view illustrating the resulting structure illustrated in FIG. 1B taken along a line I-I', including a horn H at bottom edges of recess patterns 17. Herein, a height of a horn is illustrated.

As described above, in a process combining a recess gate process to embody an ultra micronized device with a STI process, an angle α between a sidewall of the trench 15 and a top surface of the substrate 11 is designed to be 90° to minimize the height of the horn H, which is an indicator of a bottom flatness, formed during patterning to form the recess pattern.

However, if the angle α is 90°, a void is generally generated when the gap-filling insulation layer 16 is filled into the trenches 15.

In more detail, the void is generally generated when the angle α is greater than 87°, which is the angle allowing the gap-filing without generating the void. However, if the angle α is maintained at an angle of 87° or less not to generated the void, the height of the horn, which is the indicator of the bottom flatness during patterning the recess pattern, is increased.

The increase in the height of the horn often causes a refresh property to be degraded and thus, a transistor property of the ultra micronized device may be also degraded. Accordingly, it may be impossible to implement the desired devices.

SUMMARY

The present invention provides a method for fabricating a semiconductor device capable of preventing a void from being generated when a gap-filling insulation layer is filled in a trench for device isolation and securing a bottom flatness of a recess pattern.

Consistent the present invention, there is provided a method for fabricating a semiconductor including: etching a substrate to a predetermined depth to form an upper trench with taper edges; etching the substrate beneath the upper trench to form a lower trench with approximately vertical edges; forming a device isolation layer disposed within the upper and lower trenches; and etching an active region of the substrate defined by the upper and lower trenches to a predetermined depth to form a recess pattern for a gate.

BRIEF DESCRIPTION OF THE DRAWINGS

The above and other features of the present invention will become better understood with respect to the following description of embodiments of the present invention given in conjunction with the accompanying drawings, in which.

DETAILED DESCRIPTION

Hereinafter, detailed descriptions on certain embodiments of the present invention will be provided with reference to the accompanying drawings.

FIGS. 2A to 2E are cross-sectional views illustrating a method for fabricating a semiconductor device consistent with a first embodiment of the present invention.

Figure 1A:
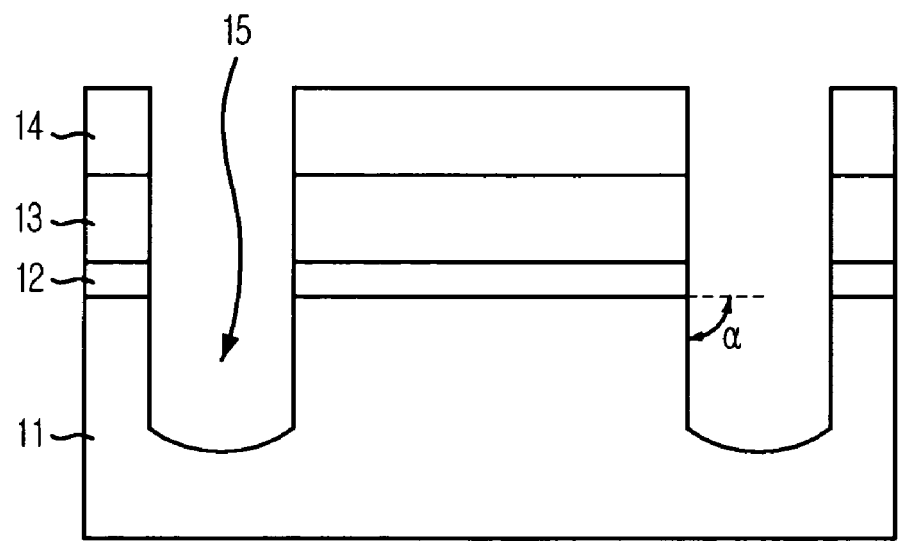
FIGS. 1A and 1B are cross-sectional views illustrating a typical method for fabricating a semiconductor device.
Figure 1B:
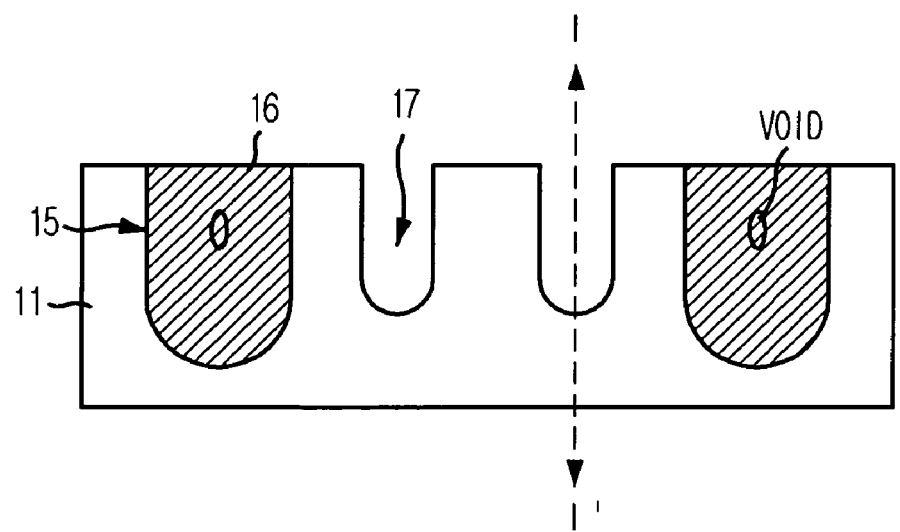
Figure 1C:
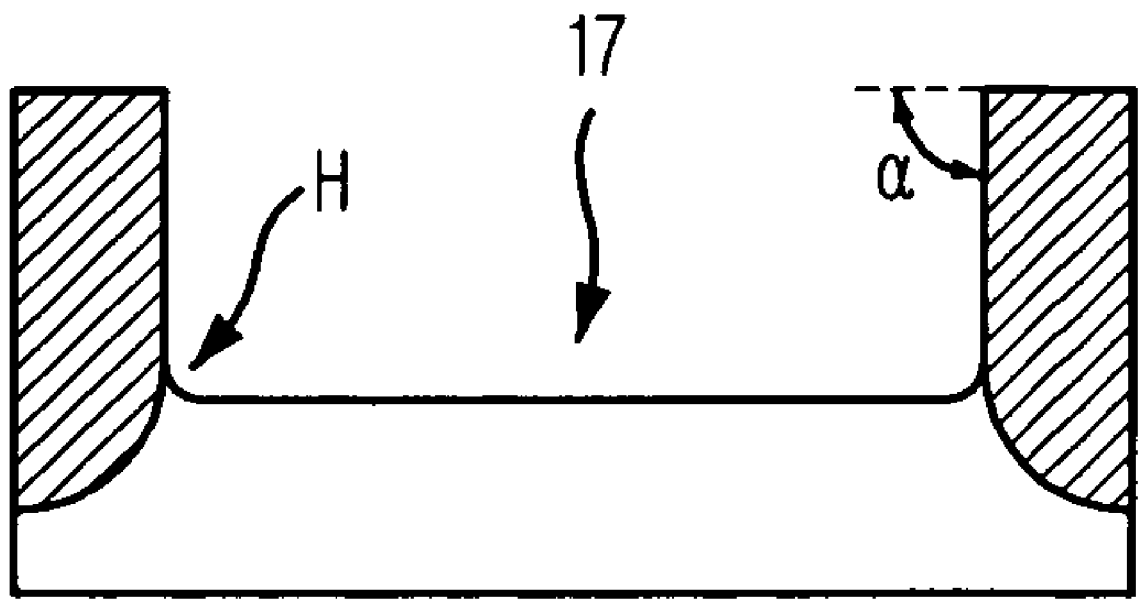
FIG. 1C is a cross-sectional view of the semiconductor device taken along a line I-I' in FIG. 1B.
Figure 2A:
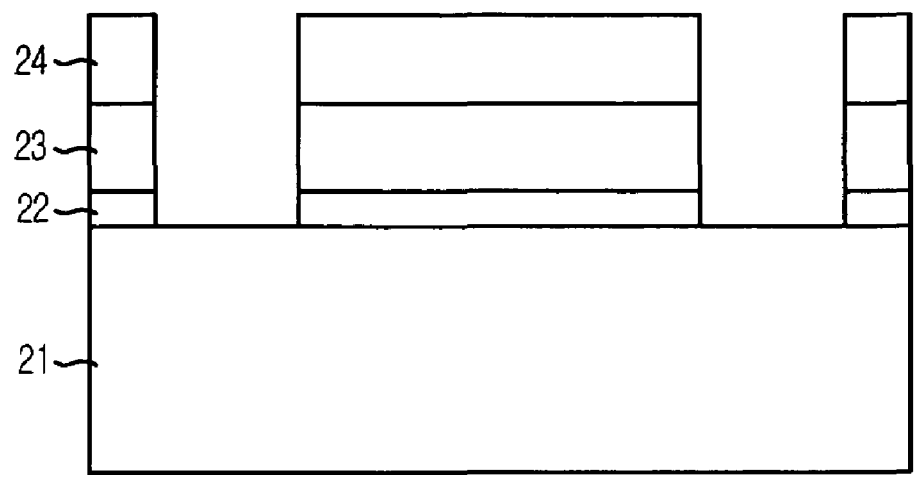
FIGS. 2A to 2E are cross-sectional views illustrating a method for fabricating a semiconductor device consistent with a first embodiment of the present invention.

As shown in FIG. 2A, a patterned pad oxide layer 22, a patterned pad nitride layer 23, and a photoresist pattern 24 are formed over a substrate 21 in which trenches are to be formed.

Although not shown, formation processes of the patterned pad oxide layer 22, the patterned pad nitride layer 23 and the photoresist pattern 24 will be explained hereinafter.

A pad oxide layer, and a hard mask layer or a pad nitride layer used as a stopper during a chemical mechanical polishing (CMP) process are formed over the substrate 21.

A photoresist layer for argon fluoride (ArF) is formed and then, patterned through a photo-exposure process and a developing process to form the photoresist pattern 24.

The pad nitride layer and the pad oxide layer are etched using the photoresist pattern 24 as a mask. Thus, the patterned pad nitride layer 23 and the patterned pad oxide layer 22 are formed. The pad nitride layer and the pad oxide layer may be etched by using a fluorine-based plasma in one of a transformer coupled plasma (TCP) reactor and an inductively coupled plasma (ICP) reactor. Also, a source power and a bias power are simultaneously applied.

In more detail about the etching process of the pad nitride layer and the pad oxide layer, a source power ranging from approximately 300 W to approximately 500 Ws, and a pressure ranging from approximately 30 mTorr to approximately 100 mTorr are supplied into the TCP reactor or the ICP reactor. A mixture gas, obtained by mixing fluorocarbon (CF) based gas and hydrofluorocarbon (CHF) based gas in a ratio of approximately 1: approximately 1 to 2 is supplied, and oxygen ($O_2$) gas or argon (Ar) gas may be added thereto as a reaction gas. Herein, the CF based gas includes tetrafluoromethane ($CF_4$) gas, and the CHF based gas includes trifluoromethane ($CHF_3$) gas. In a first exemplary recipe for the above etching process, the pressure is approximately 80 mTorr, the source power is approximately 300 W, a flow rate of the $CF_4$ gas is approximately 30 sccm (standard cubic centimeters per minute), a flow rate of the $CHF_3$ gas is approximately 50 sccm, and a flow rate of the $O_2$ gas is approximately 3 sccm. In a second exemplary recipe, the pressure is approximately 80 mTorr, the source power is approximately 300 W, a flow rate of the $CF_4$ gas is approximately 30 sccm, a flow rate of the $CHF_3$ gas is approximately 50 sccm, and a flow rate of the $O_2$ gas is approximately 2 sccm. In a third recipe, the pressure is approximately 300 mTorr, the source power is approximately 400 W, a flow rate of the $CF_4$ gas is approximately 200 sccm, and a flow rate of the $CHF_3$ gas is approximately 90 sccm.

Figure 2B:
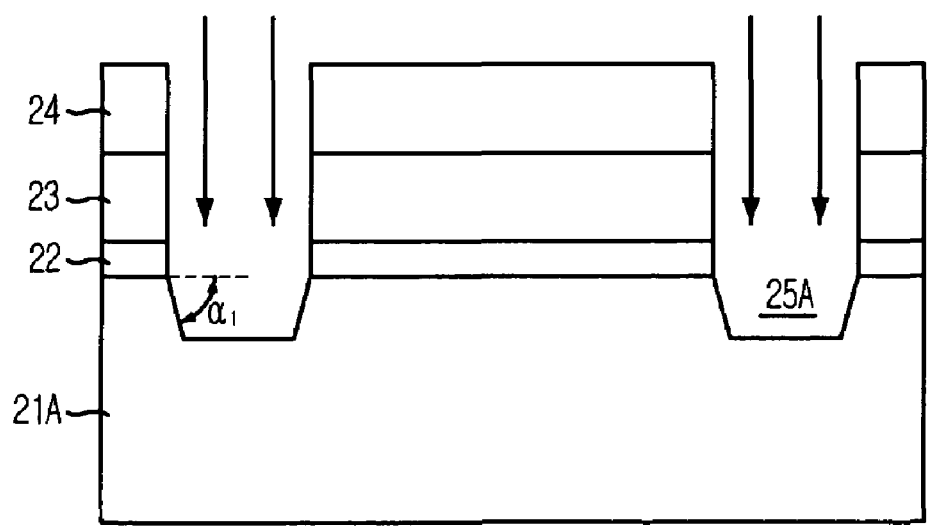

As shown in FIG. 2B, the substrate 21 (e.g., a silicon substrate) is etched using the photoresist pattern 24, the patterned pad nitride layer 23, and the patterned pad oxide layer 22 as a mask to form a plurality of upper trenches 25A for device isolation. Herein, a patterned substrate will be referred to as a first substrate denoted with a reference numeral 21A.

Figure 2C:
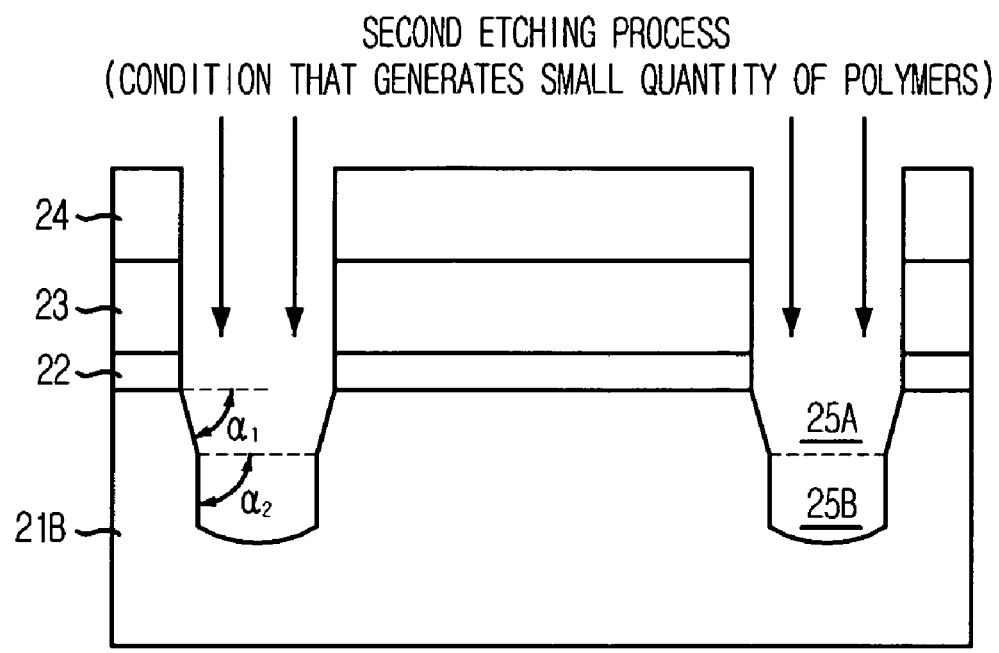

Consistent with the first embodiment of the present invention, the etching process to form the trenches, each including an upper trench 25A (refer to FIG. 2B) and a lower trench 25B (refer to FIG. 2C) is performed in two steps so that a gap-filling insulation layer may be filled in the trenches without generating voids and a height of a horn of a subsequently formed recess pattern is reduced. The first step of the etching process is performed by using a taper etching method generating a large quantity of polymers such that an angle $\alpha 1$ between a sidewall of the upper trench 25A and a top surface of the substrate 21A allows gap-filling an upper portion of the upper trench 25A without generating voids. The second step of the etching process is performed such that a small quantity of polymers are generated at a predetermined depth in which the horn of the recess pattern is formed. Accordingly, as illustrated in FIG. 2C, a sidewall of the lower trench 25B forms an angle $\alpha 2$ of approximately 90° with the top surface of substrate 21B, as a result of which the height of the horn the subsequently formed recess pattern is minimized.

Hereinafter, the above mentioned two steps of the etching process will be described in detail. Herein, the first step of the etching process and the second step of the etching process will be referred to as "first etching process" and "second etching process," respectively.

Referring to FIG. 2B, the silicon substrate 21 is subjected to the first etching process using the photoresist pattern 24, the patterned pad nitride layer 23 and the patterned pad oxide layer 22 as a mask and thus, the upper trenches 25A are formed. As mentioned above, the first etching process generates a large quantity of polymers.

Particularly, the first etching process is carried out using the taper etching method generating the polymers. The taper etching method makes the profile angle $\alpha 1$ less than approximately 90°.

As described above, the taper etching method can be carried out using a reaction plasma capable of generating a large quantity of polymers, i.e., a plasma of CHF based gas, since the taper etching method easily reacts with the silicon based substrate 21.

The first etching process is performed in a high taper profile condition that makes the upper trenches 25A have a high taper profile. For example, the angle $\alpha 1$ may range from approximately 70° to approximately 80°. That is, the profile of the upper trench 25A becomes tapered to a greater extent.

The high taper profile condition includes a high density plasma, obtained using a TCP or ICP reactor, a source power ranging from approximately 100 W to approximately 500 W, particularly, from approximately 300 W to approximately 500 W, and a bias power ranging from approximately 270 Wb to approximately 350 Wb. A mixture gas, obtained by mixing approximately 1 part of CF based gas to approximately 1 part to 2 parts of CHF based gas is used, and argon (Ar) gas is added thereto as a reaction gas. Herein, the CF based gas includes $CF_4$ gas, and the CHF based gas includes $CHF_3$ gas. For instance, in one exemplary recipe, the pressure is approximately 40 mTorr, the source power is approximately 100 W, the bias power is approximately 350 Wb, a flow rate of the $CF_4$ gas is approximately 10 sccm, a flow rate of the $CHF_3$ gas is approximately 20 sccm, and a flow rate of the Ar gas is approximately 50 sccm.

Consistent with the first embodiment of the present invention, the first etching process is performed to form the high taper profile and thus, top corners of the upper trenches 25A are rounded such that the angle $\alpha 1$ is less than approximately 90°.

As shown in FIG. 2C, the second etching process is performed on the first substrate 21A to form a lower trench 25B under a condition that generates a small quantity of polymers, as a result of which an angle $\alpha 2$ between a sidewall of the lower trench 25B and the bottom of the upper trench 25A is approximately 90°. In other words, the lower trench 25B has a vertical profile. A further patterned silicon substrate will be referred to as a second substrate denoted with a reference numeral 21B.

The respective lower trench 25B is formed at a higher position than where a horn of a subsequent recess pattern is generated. In other words, the lower trench 25B is formed by etching a predetermined portion of the substrate 21A at a higher position than the portion where the horn of the recess pattern is generated.

During the second etching process, the angle $\alpha 2$ is controlled to be approximately 90° to minimize the height of the horn, which is an indicator of a bottom flatness of the recess pattern when the recess pattern is subsequently formed.

The second etching process described above is performed in a condition that generates a small taper etch profile of the lower trench 25B or in a condition that generates a vertical etch profile of the lower trench 25B. Herein, the former condition and the later conditions are regarded to as "small taper profile condition" and "vertical profile condition" respectively.

The vertical profile condition is a condition that makes the angel $\alpha 2$ greater than approximately 88°. The vertical profile condition includes a source power ranging from approximately 1,000 W to approximately 1,500 W, a bias power ranging from approximately 100 Wb to approximately 250 Wb, and a mixture gas including chlorine ($Cl_2$) gas and hydrogen bromide (HBr) mixed in a ratio of approximately 1 to approximately 3, along with a high density plasma obtained using a TCP or ICP reactor. Also, oxygen ($O_2$) gas can be added to the mixture gas of $Cl_2$ and HBr, and may have a flow rate of approximately 10 sccm, approximately one tenth of a flow rate of the mixture gas of $Cl_2$ and HBr.

The small taper profile condition is a condition that makes the angle $\alpha 2$ range from approximately 80 to approximately 87°. A source power ranging from approximately 400 W to approximately 1,000 W, a bias power ranging from approximately 250 Wb to approximately 400 Wb, and a mixture gas including $Cl_2$ gas and Br gas in a ratio of approximately 1: approximately 1 to 3 are used along with a high density plasma obtained using a TCP reactor or ICP reactor to provide this angle $\alpha 2$ ranging from approximately 80° to approximately 87°. Also, $O_2$ gas can be added to the mixture gas of HBr and $Cl_2$, and may have a flow rate of approximately 10 sccm, approximately one tenth of a flow rate of the mixture gas of HBr and $Cl_2$.

As a result, each of the trenches 25 includes the upper trench 25A which has a sidewall forming an angle of less than approximately 90° with the top surface of the first substrate 21A, and the lower trench 25B which has a sidewall forming an angle of approximately 90° with the top surface of the substrate 21B.

Table 1 illustrates comparison results obtained using process conditions to give a taper profile of a trench. A top corner of the trench can be round while forming the taper profile.

TABLE 1

| ITEM | BAY | RECIPE CONTENT |
|---|---|---|
| BASE | | 10 mT/1,300 W/225 Wb/20$Cl_2$/60HBr/3$O_2$ |
| Top Round (Horizontal) | T1 | 40 mT/100 W/350 Wb/10$CF_4$/20$CHF_3$/50Ar |
| | T2 | 40 mT/100 W/350 Wb/10$CF_4$/30$CHF_3$/50Ar |
| Top Round (Vertical) | T3 | 40 mT/100 W/350 Wb/10$CF_4$/20$CHF_3$/50Ar |
| | T4 | 40 mT/100 W/350 Wb/10$CF_4$/30$CHF_3$/50Ar |
| Vertical (Vertical) | T5 | 10 mT/1,300 W/270 Wb/20$Cl_2$/60HBr/3$O_2$ |
| | T6 | 10 mT/1,100 W/270 Wb/20$Cl_2$/60HBr/3$O_2$ |

TABLE 1-continued

| ITEM | BAY | RECIPE CONTENT |
|---|---|---|
| Increased in Temperature | T7 | 40 mT/100 W/350 Wb/10$CF_4$/30$CHF_3$/50Ar |
| | T8 | 10 mT/1,300 W/270 Wb/15$Cl_2$/65HBr/3$O_2$ |

Table 2 illustrates comparison results obtained using different angles according to Table 1.

TABLE 2

| | Angle | | | | | | | | |
|---|---|---|---|---|---|---|---|---|---|
| | Base | T1 | T2 | T3 | T4 | T5 | T6 | T7 | T8 |
| ITEM | Base | Top Round (Horizontal) | | Top Round (Vertical) | | Vertical (Vertical) | | Increase of Temperature | |
| Average Angle | 89.8 | 83.0 | 83.8 | 86.9 | 86.3 | 87.1 | 88.2 | 84.6 | 86.4 |

As illustrated in Table 2, the angles of the trenches T1 to T4 are less than approximately 87°, and the angles of the trenches T5 and T6 approach to a vertical angle since the angles of the trenches T5 and T6 are greater than approximately 87°.

Since it is possible to make the angle of the trench smaller than approximately 87°, which allows gap-filling through a temperature control, the first etching process is performed at an electrode temperature equal to or less than approximately 30° C., e.g., from approximately 10° C. to approximately 30° C.

Figure 2D:
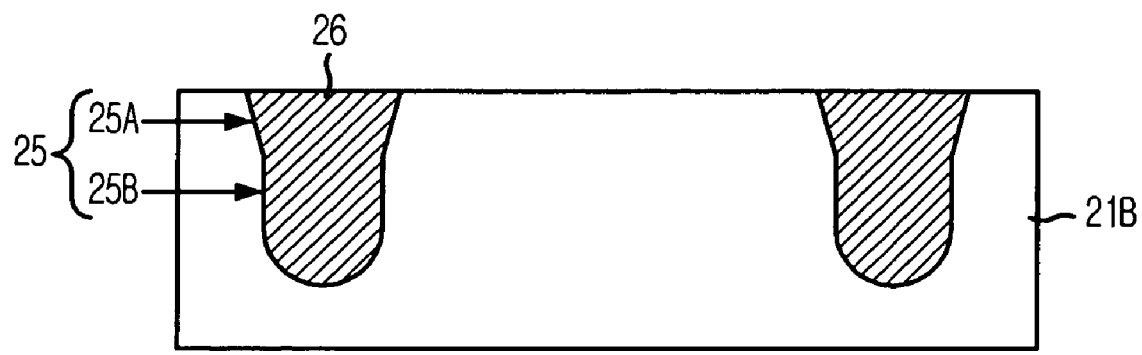

As shown in FIG. 2D, the photoresist pattern 24 is removed and then, a gap-filling insulation layer 26 is filled into the trenches 25 for the device isolation. At this time, since the angle $\alpha 1$ is smaller than approximately 90°, e.g., approximately 87°, a gap-fill margin of the gap-fill insulation layer 26 is improved. Thus, it is possible to fill the trenches 25 with the gap-filling insulation layer 26 without generating voids. Herein, the bottom surface of the trench 25 becomes rounded because an isotropic etching process is additionally carried out after the second etching process.

A device isolation CMP process is performed by using the patterned pad oxide layer 22 and the patterned pad nitride layer 23 as a mask and then, the patterned pad nitride layer 23 and the patterned pad oxide layer 22 are removed. At this time, the patterned pad nitride layer 23 is removed using a solution of phosphoric acid ($H_3PO_4$), and the patterned pad oxide layer 22 is removed using a solution of hydrogen fluoride (HF).

Figure 2E:
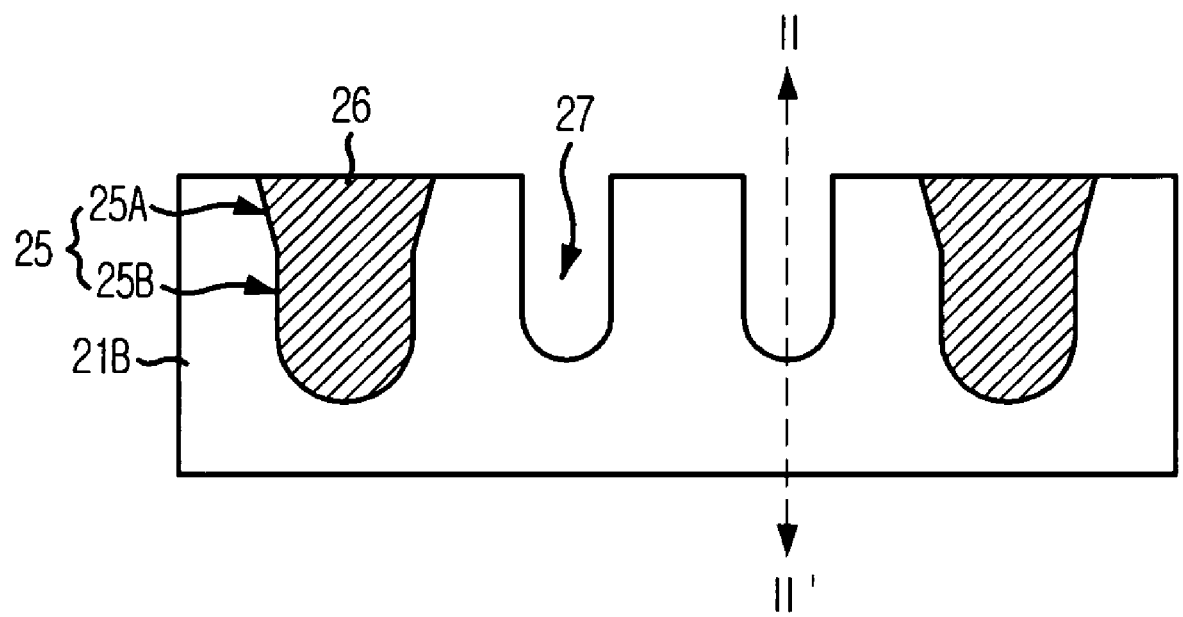

As shown in FIG. 2E, a recess gate etching process is performed on an active region defined by the trenches 25 to form a plurality of recess patterns in which recess gates are to be formed.

Figure 3:
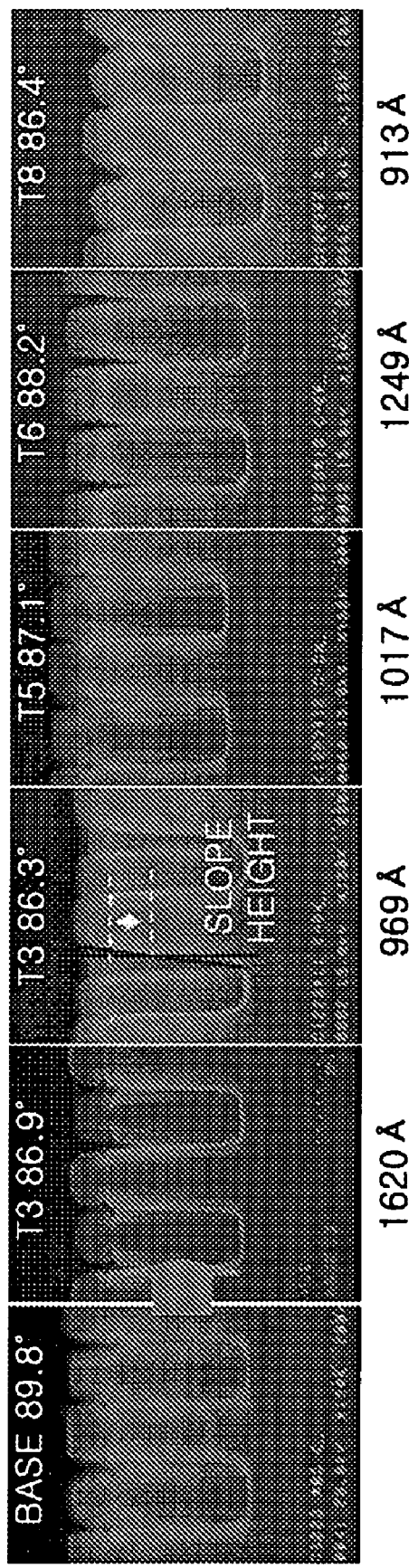
FIG. 3 shows scanning electron microscopy (SEM) images of various slopes of samples according to Tables 1 and 2.

FIG. 3 illustrates scanning electron microscopy (SEM) images of various slopes of samples according to Tables 1 and 2.

Referring to Tables 1 and 2, and FIG. 3, by controlling the process conditions to make the top corners of the trench rounded, the angle of the trench can be formed to approximately 87° or less.

Figure 4:
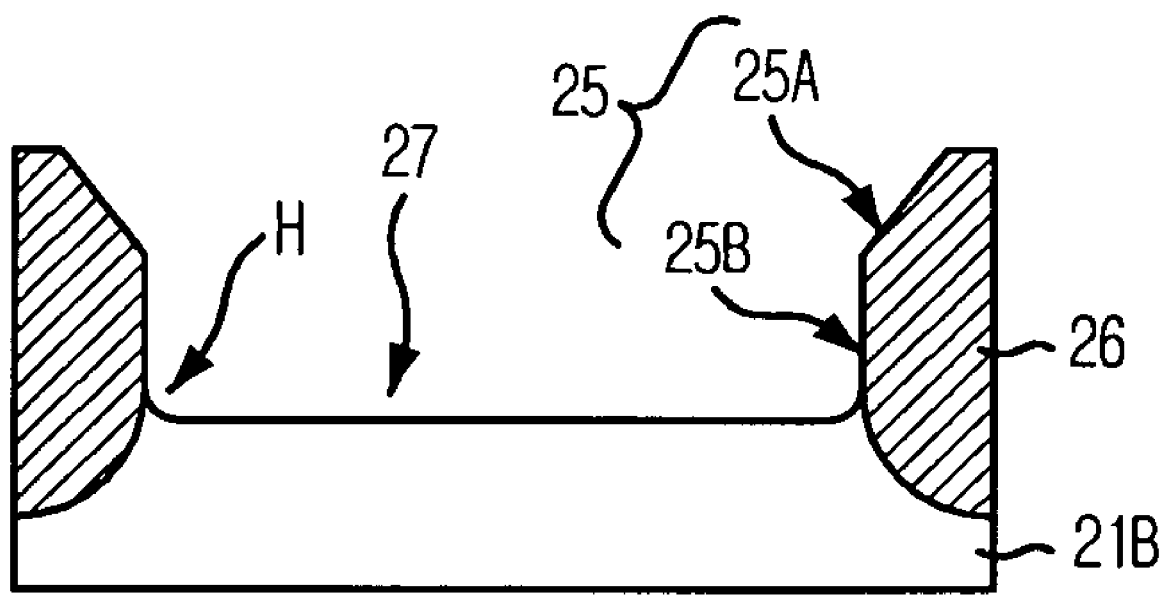
FIG. 4 is a cross-sectional view illustrating a resultant structure taken along a line II-II' in FIG. 2E.

FIG. 4 is a cross-sectional view illustrating a resultant structure taken along a line II-II' in FIG. 2E. A horn of a recess pattern is illustrated.

As shown in FIG. 4, an angle of the upper trench 25A of the trench 25 contacted with an edge of the recess pattern 27 is smaller than approximately 90°. Nevertheless, because the angle $\alpha 2$ is approximate to 90°, the height of the horn of the recess pattern 27 can minimized.

Consistent with the first embodiment of the present invention, the trench for the device isolation includes an upper region and a lower region which have different profile angles. Accordingly, the trench for the device isolation has dual profile angles.

In addition to the high density plasma obtained based on a TCP or ICP reactor, the etching process to form the trench can be carried out using a high density plasma obtained based on one selected from the group consisting of a DPS type plasma reactor, a MERIE type plasma reactor, a helican type plasma reactor, a helicon type plasma reactor, and an ECR type plasma reactor.

FIGS. 5A to 5F are cross-sectional views illustrating a method for fabricating a semiconductor device consistent with a second embodiment of the present invention.

Figure 5A:
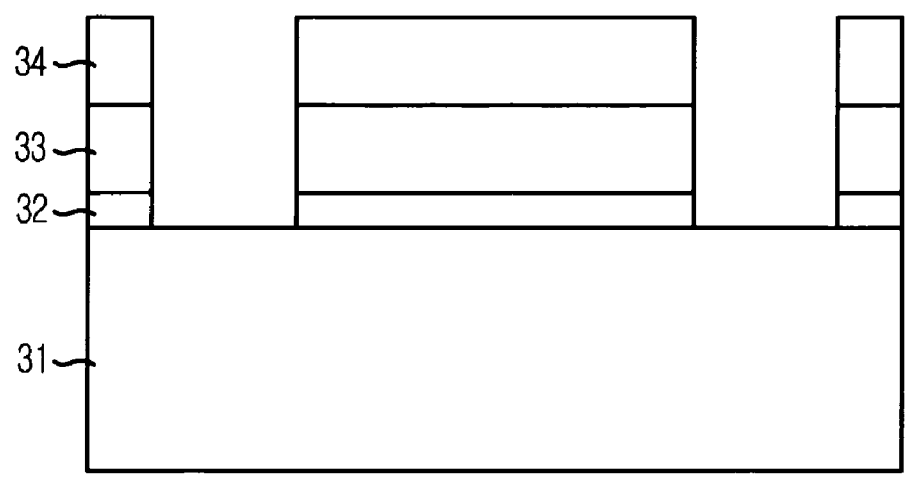
FIGS. 5A to 5F are cross-sectional views illustrating a method for fabricating a semiconductor device consistent with a second embodiment of the present invention.

As shown in FIG. 5A, a patterned pad oxide layer 32, a patterned pad nitride layer 33, and a photoresist pattern 34 are formed over a substrate 31 in which trenches are to be formed.

Although not shown, formation processes of the patterned pad oxide layer 32, the patterned pad nitride layer 33 and the photoresist pattern 34 will be explained hereinafter.

A pad oxide layer, and a hard mask layer or a pad nitride layer used as a stopper during a device isolation chemical mechanical polishing (CMP) process are formed over the substrate 31.

A photoresist layer for argon fluoride (ArF) is formed and then, patterned through a photo-exposure process and a developing process to form the photoresist pattern 34.

The pad nitride layer and the pad oxide layer are etched using the photoresist pattern 34 as a mask. Thus, the patterned nitride layer 33 and the patterned pad oxide layer 32 are formed. The pad nitride layer and the pad oxide layer may be etched using a fluorine-based plasma obtained based on a transformer coupled plasma (TCP) or inductively coupled plasma (ICP) reactor. Also, a source power and a bias power are simultaneously applied.

In more detail about the process of etching the pad nitride layer and the pad oxide layer, a source power ranging from approximately 300 W to approximately 500 W, and a pressure ranging from approximately 30 mTorr to approximately 100 mTorr are supplied into the TCP reactor or the ICP reactor. A mixture gas, obtained by mixing CF based gas and CHF based gas in a ratio of approximately 1: approximately 1 to 2 parts is supplied, and oxygen ($O_2$) gas or argon (Ar) gas may be added thereto as a reaction gas. Herein, the CF based gas includes tetrafluoromethane ($CF_4$) gas, and the CHF based gas includes trifluoromethane ($CHF_3$) gas. In a first exemplary recipe for the above etching process, the pressure is approximately 80 mTorr, the source power is approximately 300 W, a flow rate of the $CF_4$ gas is approximately 30 sccm, a flow rate of the $CHF_3$ gas is approximately 50 sccm, and a flow rate of the $O_2$ gas is approximately 3 sccm. In a second exemplary recipe, the pressure is approximately 80 mTorr, the source power is approximately 300 W, a flow rate of the $CF_4$ gas is approximately 30 sccm, a flow rate of the $CHF_3$ gas is approximately 50 sccm, and a flow rate of the $O_2$ gas is approximately 2 sccm. In a third recipe, the pressure is approximately 300 mTorr, the source power is approximately 400 W, a flow rate of the $CF_4$ gas is 200 sccm, and a flow rate of the $CHF_3$ gas is approximately 90 sccm.

Figure 5B:
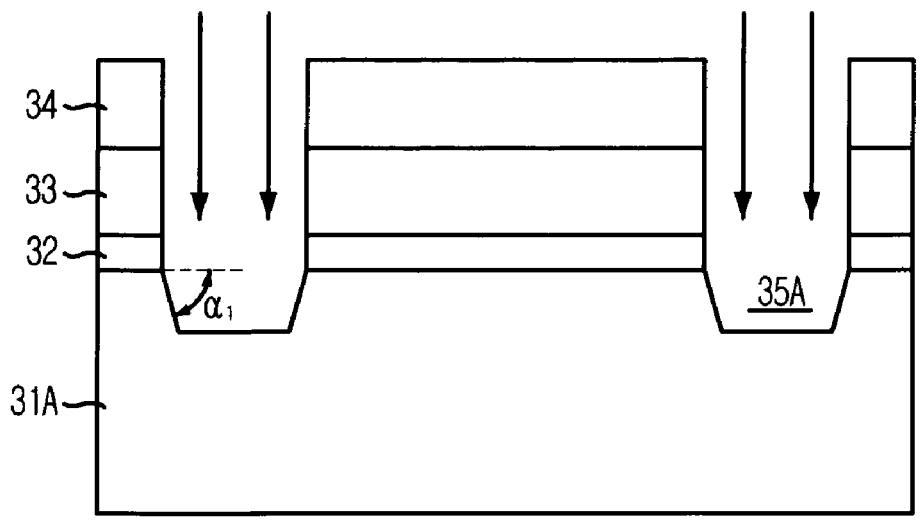

As shown in FIG. 5B, the substrate 31 (e.g., a silicon substrate) is etched using the photoresist pattern 34, the patterned pad nitride layer 33, and the patterned pad oxide layer 32 as a mask to form a plurality of trenches 25A for device isolation. Herein, a patterned substrate will be referred to as a first silicon substrate denoted as a reference numeral 31A.

Consistent with the second embodiment of the present invention, the trench etching process to form trenches, each including a upper trench 35A (refer to FIG. 5B), a middle trench 35B (refer to FIG. 5C), and a lower trench 35C (refer to FIG. 5D), is performed in three steps so that a gap-filling insulation layer may be filled in the trenches without generating voids and a height of a horn of a subsequently formed recess pattern is reduced. The first step of the etching process is performed by performing a taper etching method generating a large quantity of polymers in a condition such that an angle $\alpha 1$ between a sidewall of the upper trench 35A and a top surface of the substrate 31A allows gap-filling an upper portion of the upper trench 35A without generating voids. The second step of the etching process is performed in a condition such that a small quantity of polymers are generated at a predetermined depth in which the horn of the recess pattern is formed. Accordingly, an angle $\alpha 2$ between a sidewall of the middle trench 35B and the top surface of the substrate 31B is approximately 90°. In the third step of the etching process, the taper etching method that generates a large quantity of polymers is performed and thus, the height of the horn is minimized.

Hereinafter, the above mentioned three steps of the etching process will be described in detail. Herein, the first step of the etching process, the second step of the etching process and the third step of the etching process will be referred to as "first etching process", "second etching process", and "third etching process".

Referring to FIG. 5B, the substrate 31 is subjected to the first etching process using the photoresist pattern 34, the patterned pad nitride layer 33 and the patterned pad oxide layer 32 as a mask and thus, a plurality of upper trenches 35A are formed. As mentioned above, the first etching process generates a large quantity of polymers.

Particularly, the first etching process is carried out using the taper etching method that generates the polymers. The taper etching method results in the angle $\alpha 1$ being less than approximately 90°.

As described above, the taper etching method can be carried out using a reaction plasma, i.e., a CHF based plasma, capable of generating a large quantity of polymers, since the taper etching method easily reacts with the silicon based substrate 31.

The first etching process is performed in a high profile condition that makes the first trench 35A have a high taper profile. For example, the high taper profile condition may result in the angle $\alpha 1$ ranging from approximately 70° to approximately 80°.

The high taper profile condition includes a high density plasma, obtained using a TCP or ICP reactor, a source power ranging form approximately 100 W to approximately 500 W, particularly, from approximately 300 W to approximately 500 W, and a bias power ranging from approximately 270 Wb to approximately 350 Wb. A mixture gas, obtained by mixing approximately 1 part of CF based gas to approximately 1 part to 2 parts of CHF based gas is used, and argon (Ar) gas is added thereto as a reaction gas. Herein, the CF based gas includes $CF_4$ gas, and the CHF based gas includes $CHF_3$ gas. For instance, one exemplary recipe includes a pressure of approximately 40 mTorr, a source power of approximately 100 Ws, a bias power of approximately 350 Wb, a flow rate of the $CF_4$ gas of approximately 10 sccm, a flow rate of the $CHF_3$ gas of approximately 20 sccm, and a flow rate of the Ar gas of approximately 50 sccm.

Consistent with the second embodiment of the present invention, the first etching process is performed in the high taper profile condition and thus, top corners of the upper trench 35A are rounded such that the angle α1 is less than approximately 90°.

Figure 5C:
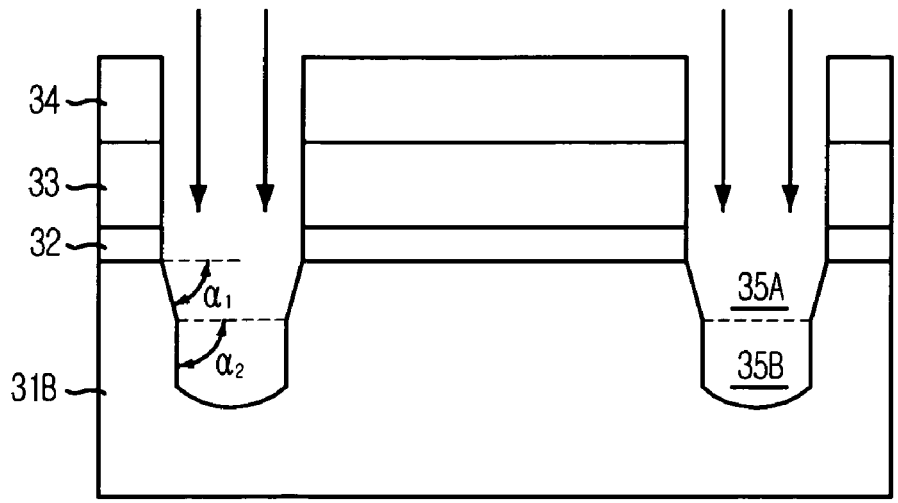

As shown in FIG. 5C, the second etching process is performed under a vertical profile condition on the first silicon substrate 31A to form the middle trenches 35B, a sidewall of which forms an angle α2 of approximately 90° with respect to the bottom of the upper trench 35A. The vertical profile condition generates a small quantity of polymers. Hereinafter, a further patterned silicon substrate will be referred to as a second substrate denoted with a reference numeral 31B.

The middle trench 35B is formed at a position higher than a portion where a horn of a subsequently formed recess pattern is generated. In other words, the middle trench 35B is formed by etching a predetermined portion higher than the portion where the horn of the recess pattern is generated.

During the second etching process, the angle α2 is controlled to be approximately 90° to minimize the height of the horn, which is an indicator of a bottom flatness of the recess pattern during forming the subsequent recess pattern.

The second etching process described above is performed in a condition that gives a small taper etch profile of the middle trench 35B or in a condition that gives a vertical etch profile of the middle trench 35B. Herein, the former condition and the later condition are regarded to as "small taper profile condition" and "vertical profile condition" respectively.

The vertical profile condition is a condition that makes the angle α2 greater than approximately 88°. To provide the angle of approximately 88° or higher, a source power ranging from approximately 1,000 W to approximately 1,500 W, a bias power ranging from approximately 100 Wb to approximately 350 Wb, and a mixture gas including chlorine ($Cl_2$) gas and hydrogen bromide (HBr) mixed in a ratio of approximately 1 to approximately 3 are used along with a high density plasma obtained using a TCP or ICP reactor. Also, oxygen ($O_2$) gas can be added to the mixture gas of $Cl_2$ and HBr at a flow rate of approximately 10 sccm, approximately one tenth of the flow rate of the mixture gas of $Cl_2$ and HBr.

The small taper profile condition is a condition that makes the angle α2 in a range of approximately 80° to approximately 88°. A source power ranging from approximately 400 W to approximately 1,000 W, a bias power ranging from approximately 350 Wb to approximately 400 Wb, and a mixture gas including $Cl_2$ gas and HBr gas in a ratio of approximately 1 to approximately 3 are used along with a high density plasma obtained using a TCP or ICP reactor to provide this angle α2 ranging from approximately 80° to approximately 88°. Also, $O_2$ gas can be added to the mixture gas of $Cl_2$ and Hbr at a flow rate of approximately 10 sccm, approximately one tenth of the flow rate of the mixture gas of HBr and $Cl_2$.

Figure 5D:
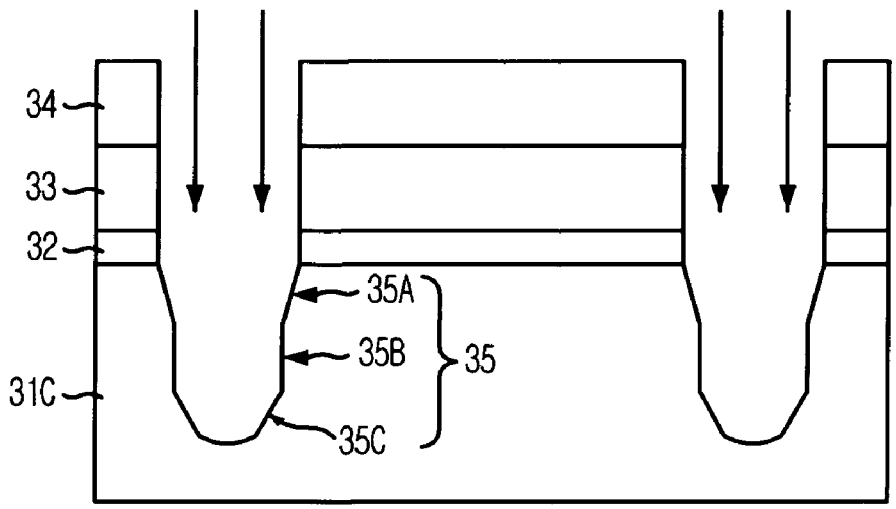

As shown in FIG. 5D, the third etching process is performed.

The third etching process is performed in a condition that generates a large quantity of polymers similarly to the condition of the first etching process.

The third etching process is carried out using the taper etching method that generates the polymers. The taper etching method makes an angle of less than approximately 90° between a sidewall of the lower trench 35C and the top surface of the substrate 31C, wherein 31C refers to the substrate 31B further etched by the third etching process.

As described above, the taper etching method can be carried out using a reaction plasma, i.e., a CHF based plasma, capable of generating a large quantity of polymers, since the taper etching method easily reacts with the silicon based substrate 31.

The third etching process is performed in a high taper profile condition that makes the third trench 35C have a high taper profile. Herein, the high taper profile condition for the third etching process is such that an angle between the sidewall of the third trench 35C and the top surface of the third substrate 31C ranges from approximately 70° to approximately 80°.

The high taper profile condition for the third etching process includes a high density plasma, obtained using a TCP or ICP reactor, a source power ranging from approximately 300 W to approximately 500 W, and a bias power ranging from approximately 300 Wb approximately 400 Wb. A mixture gas, obtained by mixing approximately 1 part of CF based gas to approximately 1 part to 2 parts of CHF based gas is used, and argon (Ar) gas is added thereto as a reaction gas. Herein, the CF based gas includes $CF_4$ gas, and the CHF based gas includes $CHF_3$ gas. For instance, one exemplary recipe includes a pressure of approximately 40 mTorr, a source power of approximately 100 Ws, a bias power of approximately 350 Wb, the $CF_4$ gas having a flow rate of approximately 10 sccm, the $CHF_3$ gas having a flow rate of approximately 20 sccm, and the Ar gas having a flow rate of approximately 50 sccm.

Figure 5E:
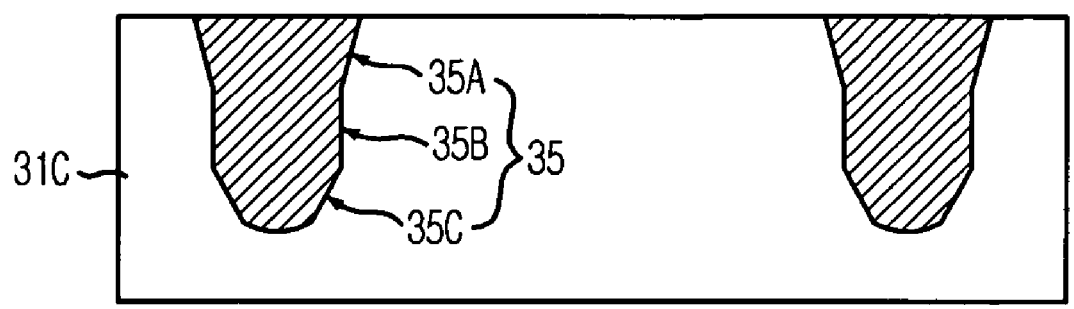

As shown in FIG. 5E, the photoresist pattern 34 is removed and then, a gap-filling insulation layer 36 is filled in each of the trenches 35. At this time, since the angles of the upper trench 35A and the lower trench 35C are less than approximately 90°, a gap-fill margin of the gap-filling insulation layer 36 is improved and thus, it is possible to gap-fill the gap-fill insulation layer 36 without generating voids.

A CMP process is performed using the patterned pad nitride layer 33 as a mask and then, the patterned pad nitride layer 33 and the patterned pad oxide layer 32 are removed. At this time, the patterned pad nitride layer 33 are removed by using a solution of phosphoric acid ($H_3PO_4$), and the patterned pad oxide layer 32 are removed by using a solution of hydrogen fluoride (HF).

Figure 5F:
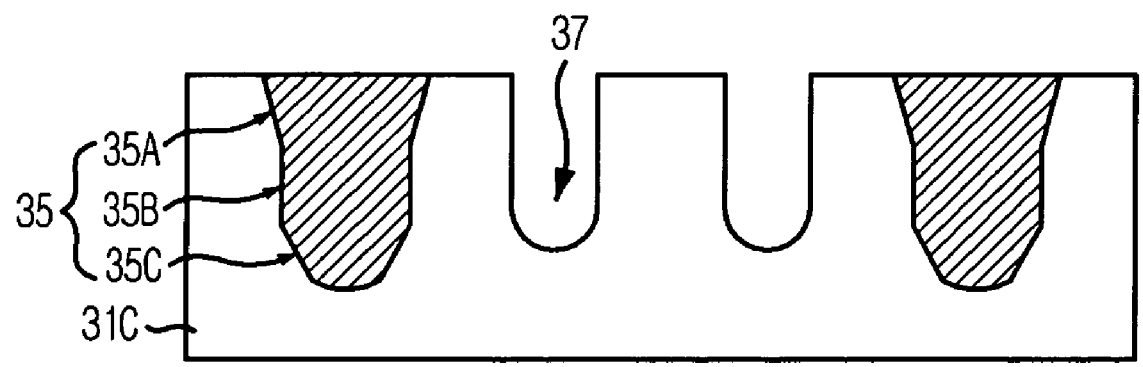

As shown in FIG. 5F, a plurality of recess patterns 37 in which recess gates are to be formed are formed by performing a recess gate etching process on an active region defined by the trenches 35.

Consistent with the second embodiment of the present invention, it is possible to improve a gap-fill margin of a trench by forming a trench having three different angles during forming the trench for a device isolation, and to minimize a height of a horn during subsequent forming of a recess pattern. The gap-fill margin of the trench having the three different angles is much more improved as compared to a trench having two different angles.

Consistent with the present invention, by forming a trench having an angle less than approximately 87° that allows easily gap-filling in an upper trench and having an angle approximate to 90° at a depth in which a horn, which is an indicator of a bottom flatness, is formed during forming a recess pattern, a height of the horn of the recess pattern can be minimized and gap-filling can be easily performed without generating voids. Accordingly, it is possible to improve reliability and yields of products, to reduce a cost, and to secure a design rule and a process margin.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
   etching a substrate to a predetermined depth to form an upper trench with taper edges;
   etching the substrate beneath the upper trench to form a lower trench with approximately vertical edges;
   etching the substrate beneath the lower trench to form a third trench with taper edges;
   forming a device isolation layer disposed within the upper trench, the lower trench, and the third trench; and
   etching an active region of the substrate defined by the upper trench, the lower trench, and the third trench to a predetermined depth to form a recess pattern for a gate.

2. The method of claim 1, wherein the etching to form the upper trench is performed in a condition that generates a greater quantity of polymers than a condition in which the etching to form the lower trench is performed.

3. The method of claim 1, wherein the etching to form the upper trench is performed using a plasma including fluorocarbon (CF)-based gas.

4. The method of claim 1, wherein the etching to form the upper trench is performed such that an angle between the taper edges of the upper trench and a top surface of the substrate ranges from approximately 70° to approximately 80°.

5. The method of claim 4, wherein the etching to form the upper trench is performed using a source power ranging from approximately 300 W to approximately 500 W, a bias power ranging from approximately 270 Wb to approximately 350 Wb, a mixture gas of CF based gas and fluorocarbon (CHF)-based gas, and argon (Ar) gas as a reaction gas.

6. The method of claim 5, wherein the CF-based gas and the CHF based gas are mixed in a ratio ranging from about 1:1 to about 1:2.

7. The method of claim 5, wherein the CF-based gas includes tetrafluoromethane ($CF_4$), and the CHF-based gas includes trifluoromethane ($CHF_3$).

8. The method of claim 1, wherein the etching to form the lower trench is performed in one of a small taper profile condition and a vertical profile condition.

9. The method of claim 8, wherein the vertical profile condition includes a source power ranging from approximately 1,000 W to approximately 1,500 W, a bias power ranging from approximately 100 Wb to approximately 250 Wb, a mixture of chlorine ($Cl_2$) gas and hydrogen bromide (HBr) gas, and oxygen ($O_2$) gas added to the mixture.

10. The method of claim 9, wherein the $Cl_2$ gas and the HBr gas are mixed in a ratio of approximately 1:3 and a flow rate of the $O_2$ gas is approximately one tenth of the flow rate of the mixture gas.

11. The method of claim 8, wherein the small taper profile condition includes a source power ranging from approximately 400 W to approximately 1,000 W, a bias power ranging from approximately 250 Wb to approximately 400 Wb, a mixture of chlorine ($Cl_2$) gas and hydrogen bromide (HBr) gas, and $O_2$ gas added to the mixture.

12. The method of claim 11, wherein the $Cl_2$ gas and the HBr gas are mixed in a ratio of approximately 1 to approximately 1 to 3.

13. The method of claim 1, wherein the etching to form the lower trench is performed using a high density plasma source reactor selected from a group consisting of a transformer coupled plasma (TCP) reactor, an inductively coupled plasma (ICP) reactor, a decoupled plasma source (DPS) reactor, a magnetically enhanced reactive ion etching (MERIE) reactor, a helical reactor, a helicon reactor, and an electron cyclotron resonance (ECR) reactor.

14. The method of claim 1, wherein:
   the etching to form the recess pattern is performed in a first portion of the substrate to generate a horn, and
   the etching to form the lower trench is performed in a second portion of the substrate from a position higher than the position where the horn is generated.

* * * * *